US012621994B2

(12) United States Patent
Kim et al.

(10) Patent No.: US 12,621,994 B2
(45) Date of Patent: May 5, 2026

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Chul Young Kim, Icheon-si (KR); Ji Yeon Baek, Icheon-si (KR); Kyung Sung Yun, Icheon-si (KR); Kyung Jin Lee, Icheon-si (KR); Sul Gi Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 406 days.

(21) Appl. No.: 18/319,260

(22) Filed: May 17, 2023

(65) Prior Publication Data

US 2024/0196608 A1     Jun. 13, 2024

(30) Foreign Application Priority Data

Dec. 12, 2022    (KR) ........................ 10-2022-0172779

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| | | | | |
|---|---|---|---|---|
| 10,103,236 | B2 * | 10/2018 | Lim ................. | H01L 21/76805 |
| 11,688,689 | B2 * | 6/2023 | Jhothiraman ..... | H01L 21/76816 |
| | | | | 257/314 |
| 2017/0278860 | A1 * | 9/2017 | Aoyama ................ | H10B 41/27 |
| 2018/0277562 | A1 * | 9/2018 | Umezawa .............. | H10B 43/27 |
| 2019/0326315 | A1 * | 10/2019 | Lee ...................... | H10D 62/292 |
| 2021/0082952 | A1 * | 3/2021 | Fukumoto ......... | H01L 21/32055 |
| 2021/0249434 | A1 * | 8/2021 | Nishikawa ............ | H10B 43/35 |
| 2021/0358868 | A1 | 11/2021 | Jhothiraman et al. | |
| 2022/0052068 | A1 * | 2/2022 | Kawaguchi ......... | H01L 23/5226 |
| 2022/0115335 | A1 | 4/2022 | Kothari et al. | |
| 2022/0310505 | A1 * | 9/2022 | Hama ................... | H10B 43/50 |

* cited by examiner

*Primary Examiner* — Cory W Eskridge
(74) *Attorney, Agent, or Firm* — WILLIAM PARK & ASSOCIATES LTD.

(57) ABSTRACT

A semiconductor device includes: a first gate structure including a cell region and a contact region; a channel structure located in the cell region of the first gate structure; and a supporter located in the contact region of the first gate structure.

22 Claims, 26 Drawing Sheets

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119(a) to Korean Patent Application No. 10-2022-0172779 filed on Dec. 12, 2022, in the Korean Intellectual Property Office, which is incorporated herein by reference in its entirety.

BACKGROUND

1. Technical Field

Embodiments of the present disclosure generally relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: a first gate structure including a cell region and a contact region; a channel structure located in the cell region of the first gate structure; and a supporter located in the contact region of the first gate structure, wherein the supporter comprises: a first oxide layer; a first nitride layer in the first oxide layer; and a second oxide layer in the first nitride layer, and wherein the supporter comprises a bowing shape.

In an embodiment, a semiconductor device may include: a first gate structure including a cell region and a contact region; a channel structure located in the cell region of the first gate structure; and a supporter located in the contact region of the first gate structure, wherein the supporter comprises: a first sealing layer; a first stressor in the first sealing layer; and a second sealing layer in the first stressor, and wherein the first stressor may apply a stress from the first sealing layer toward the second sealing layer.

In an embodiment, a manufacturing method of a semiconductor device may include: forming a stack including a cell region and a contact region; forming a first opening having a bowing shape in the contact region of the stack; and forming, in the first opening, a supporter including a first oxide layer, a first nitride layer, and a second oxide layer.

DETAILED DESCRIPTION

Various embodiments are directed to a semiconductor device having a stable structure and improved characteristics and a manufacturing method thereof.

In an embodiment, by stacking memory cells in three dimensions, it is possible to improve the degree of integration of a semiconductor device. Furthermore, in an embodiment, it is possible to provide a semiconductor device having a stable structure and improved reliability.

Hereafter, embodiments in accordance with the technical spirit of the present disclosure will be described with reference to the accompanying drawings. It will be understood that although the terms first, second, third etc. may be used herein to describe various elements, these elements should not be limited by these terms. These terms are only used to distinguish one element from another element, but not used to define only the element itself or to mean a particular sequence.

Figure 1A:
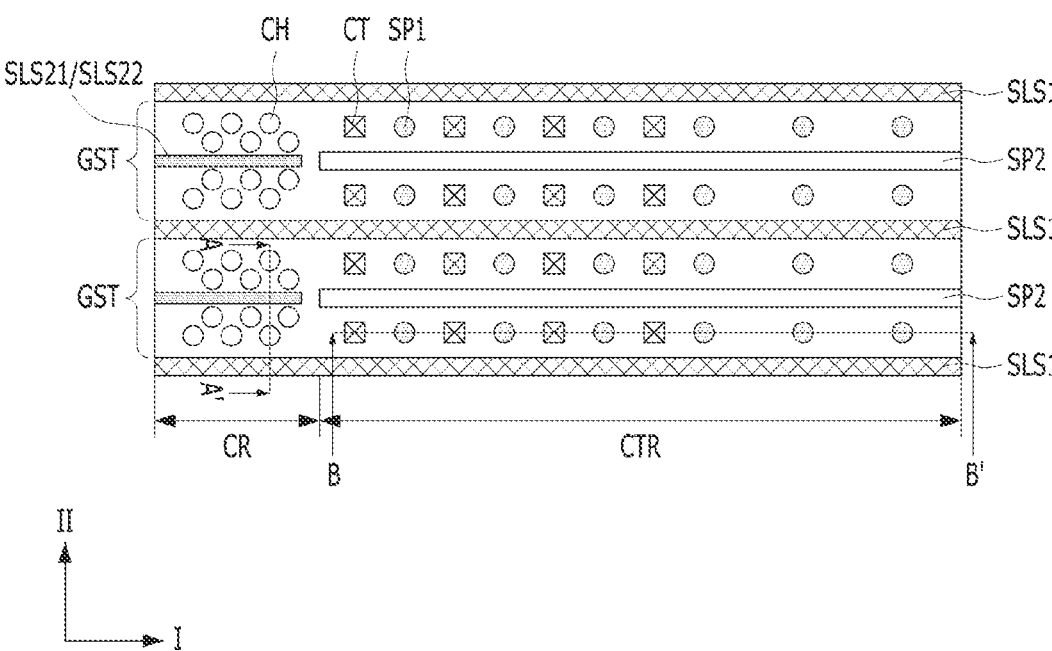
FIG. 1A, 1B, 1C, and FIG. 1D are diagrams illustrating the structure of a semiconductor device in accordance with an embodiment.

FIG. 1A to FIG. 1D are diagrams illustrating the structure of a semiconductor device in accordance with an embodiment. FIG. 1A may be a plan view, FIG. 1B may be a cross-sectional view taken along line A-A' in FIG. 1A, and FIG. 1C may be a cross-sectional view taken along line B-B' in FIG. 1A.

Figure 1B:
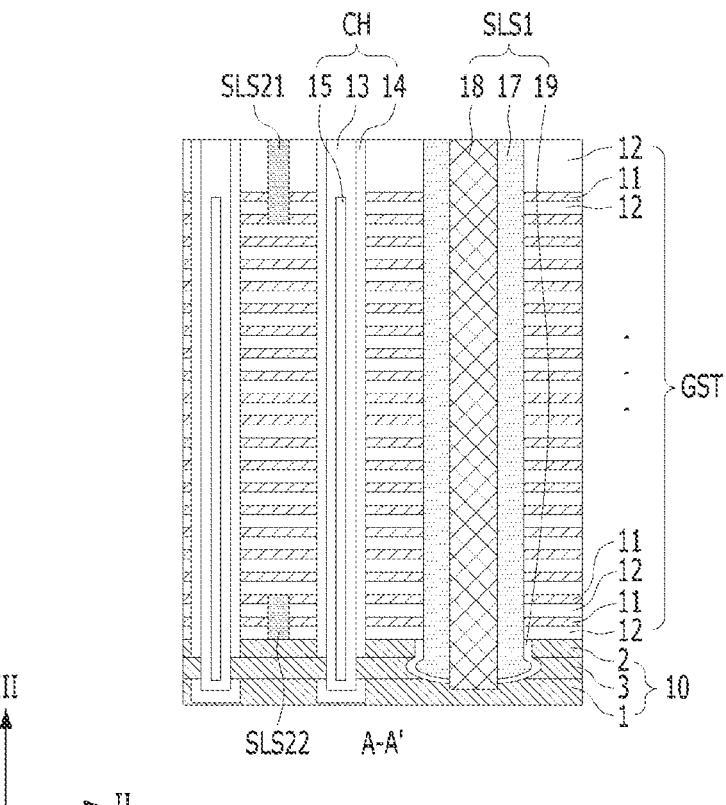
Figure 1C:
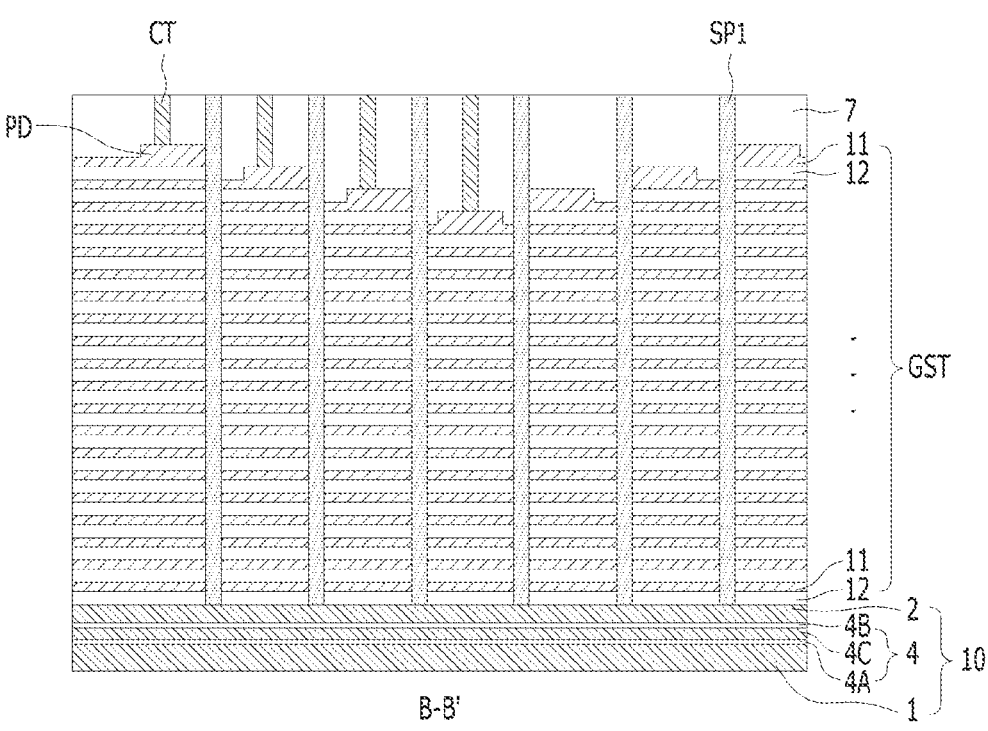
Figure 1C:
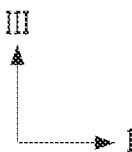

Referring to FIG. 1A to FIG. 1C, the semiconductor device may include gate structures GST, a channel structure CH, and a first supporter SP1. The semiconductor device may further include a second supporter SP2, a first slit structure SLS1, second slit structures SLS21 and SLS22, an interlayer dielectric layer 7, or a source structure 10, or a combination thereof.

The gate structure GST may be located on a lower structure such as the source structure 10. The lower structure may include a substrate, a peripheral circuit, an interconnection structure, and the like. The gate structure GST may extend in a first direction I. The gate structures GST may be located adjacent to each other in a second direction II crossing the first direction I.

The gate structure GST may include conductive layers 11 and insulating layers 12 that are alternately stacked. The conductive layers 11 may be gate lines such as word lines, bit lines, and select lines. The conductive layers 11 may each include polysilicon, tungsten (W), molybdenum (Mo), or the like, or a combination thereof. The insulating layers 12 may serve to insulate the stacked gate lines from each other, and may each include an insulating material such as oxide, nitride, or a void (not shown in the figures) including for example but not limited to a gap including air.

The gate structure GST may include a cell region CR and a contact region CTR. The cell region CR and the contact region CTR may be adjacent to each other in the first direction I. Stacked memory cells may be located in the cell region CR. An interconnection structure may be located in the contact region CTR. The interconnection structure may be connected to the stacked gate lines, and may include wiring lines, contact plugs CT, and the like.

At least a part of the contact region CTR of the gate structure GST may have a step shape. In an embodiment, at least a part of the contact region CTR of the gate structure GST may have a step shape as shown in FIG. 1C. Each of the conductive layers 11 may be exposed by the step shape. As an example, each of the gate lines may include a pad PD exposed by the step shape, and the pad PD may have a greater thickness than the remaining area. The contact plugs CT may pass through the interlayer dielectric layer 7 and may be connected to the pads PD, respectively.

The channel structure CH may be located in the cell region CR of the gate structure GST. In a plane defined by the first direction I and the second direction II crossing the first direction I, the channel structures CH may be arranged in the first direction I and the second direction II. The channel structures CH may be offset in the first direction I or the second direction II. The channel structures CH may extend in a third direction III within the gate structure GST. The third direction III may be a direction protruding from the plane defined by the first direction I and the second direction II, and may be orthogonal to the plane.

The channel structure CH may include a channel layer 13. The channel layer 13 may include a semiconductor material such as silicon (Si) or germanium (Ge). The channel structure CH may further include a memory layer 14 or an insulating core 15, or a combination thereof. The channel structure CH may extend into the source structure 10 by passing through the gate structure GST. In the cell region CR, the source structure 10 may include a third source layer 3, and may further include a first source layer 1 or a second source layer 2, or a combination thereof. As an example, the channel layer 13 may be directly connected to the third source layer 3 of the source structure 10. Alternatively, the channel layer 13 may also be connected to the source structure 10 through an epitaxial pattern or the like.

The first supporter SP1 may be located in the contact region CTR of the gate structure GST. In an embodiment, the first supporter SP1 may serve to support a stack during a manufacturing process and may have a structure with a large aspect ratio. The first supporter SP1 may extend into the interlayer dielectric layer 7 by passing through the gate structure GST. The first supporter SP1 may extend into the gate structure GST by passing through the interlayer dielectric layer 7.

The first supporter SP1 may extend to the source structure 10. In the contact region CTR, the source structure 10 may include a source sacrificial layer 4. The source sacrificial layer 4 may remain without being replaced with the third source layer 3 during the manufacturing process. The source sacrificial layer 4 may include a first sacrificial layer 4A, a second sacrificial layer 4B, or a third sacrificial layer 4C, or a combination thereof. The third sacrificial layer 4C may include a material having a high etching selectivity with respect to the first sacrificial layer 4A and the second sacrificial layer 4B. As an example, the third sacrificial layer 4C may include polysilicon, and the first sacrificial layer 4A and the second sacrificial layer 4B may each include oxide.

The first supporters SP1 may be arranged in the first direction I or the second direction II. As an example, the contact plugs CT and the first supporters SP1 may be alternately arranged along the first direction I. The first supporters SP1 may also be arranged to be offset in the first direction I or the second direction II. The first supporters SP1 may extend in the third direction III within the gate structure GST.

Figure 1D:
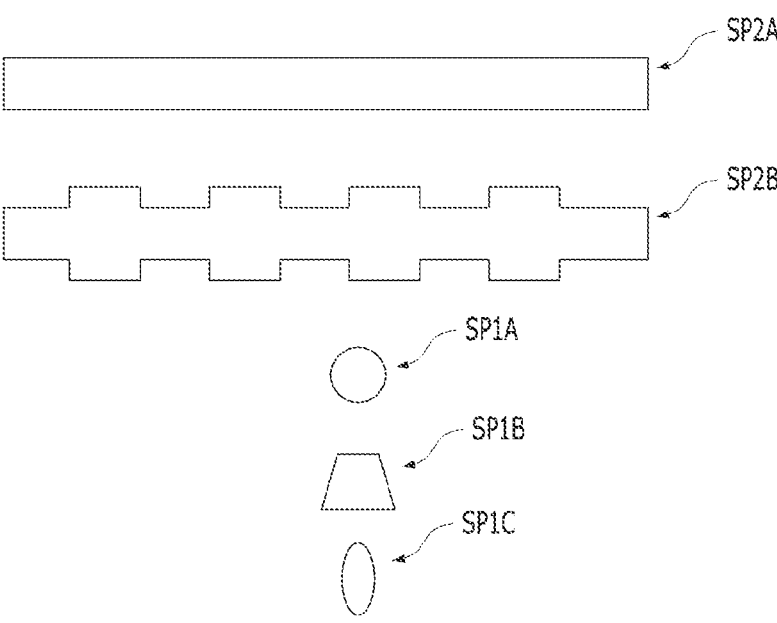

In the cross section, the first supporters SP1 may have a uniform shape or different shapes. The first supporter SP1 may have a uniform width or different widths according to levels. As an example, the first supporter SP1 may have a rectangular shape, a tapered shape, or a bowing shape. In the plane, the first supporters SP1 may have a uniform shape or different shapes. Referring to FIG. 1D, first supporters SP1A to SP1C may each have a circular shape, a polygonal shape, or an elliptical shape.

The first supporter SP1 may have a single layer structure or a multilayer structure. The first supporter SP1 may include oxide, nitride, polysilicon, a low-k material, or a high-k material, or a combination thereof. The first supporter SP1 may include a stressor for adjusting wafer warpage. As an example, the stressor may include a material having a tensile stress.

The second supporter SP2 may be located in the contact region CTR of the gate structure GST. The second supporter SP2 may serve to support the stack during the manufacturing process, and may have a structure with a large aspect ratio. The second supporter SP2 may extend to the source structure 20 through the gate structure GST. In the plane, the second supporter SP2 may extend in the first direction I. The first supporter SP1 and the contact plug CT may be located between the second supporters SP2 adjacent to each other in the second direction II. The second supporter SP2 may extend in the third direction III within the gate structure GST.

In the cross section, the second supporter SP2 may have a uniform shape or different shapes. The second supporter SP2 may have a uniform width or different widths according to levels. As an example, the second supporter SP2 may have a rectangular shape, a tapered shape, or a bowing shape. In the plane, the second supporters SP2 may have a uniform shape or different shapes. Referring to FIG. 1D, second supporters SP2A and SP2B may each have a line shape, or a line shape including a protrusion.

The second supporter SP2 may have a single layer structure or a multilayer structure. The second supporter SP2 may include oxide, nitride, polysilicon, a low-k material, or a high-k material, or a combination thereof. The second supporter SP2 may include a stressor for adjusting wafer warpage. As an example, the stressor may include a material having a tensile stress.

The first slit structure SLS1 may be located between the gate structures GST. The first slit structure SLS1 may serve to electrically insulate the gate structures GST. As an example, first gate lines included in a first gate structure and second gate lines included in a second gate structure may be electrically insulated by the first slit structure SLS1. In the plane, the first slit structure SLS1 may extend in the first direction I. As an example, the first slit structure SLS1 may extend from the cell region CR to the contact region CTR.

In the cross section, the first slit structure SLS1 may extend along the third direction III, and may extend into the source structure 10. The first slit structure SLS1 may include an insulating material or a conductive material, or a combination thereof. As an example, the first slit structure SLS1 may include a source contact plug 18, a first insulating spacer 17, and a second insulating spacer 19, or a combination thereof. The source contact plug 18 may be electrically connected to the source structure 10. As an example, the source contact plug 18 may include a conductive material such as polysilicon or metal. The source contact plug 18 may also include a non-conductive material such as undoped polysilicon, instead of a conductive material.

The first insulating spacer 17 may serve to insulate the source contact plug 18 from the conductive layers 11. The first insulating spacer 17 may surround sidewalls of the source contact plug 18. The first insulating spacer 17 may extend along the sidewalls of the source contact plug 18 in the third direction III. The first insulating spacer 17 may include a stressor for adjusting wafer warpage. As an example, the stressor may include a material having a tensile stress.

In an embodiment, the second insulating spacer 19 may serve to protect the source structure 10 during the manufacturing process. The second insulating spacer 19 may partially surround the first insulating spacer 17. As an example, the second insulating spacer 19 may be located between the first insulating spacer 17 and the source structure 10. The second insulating spacer 19 may include an oxide layer formed by oxidizing the source structure 10.

The second slit structures SLS21 and SLS22 may be located in the cell region CR of the gate structure GST. The second slit structures SLS21 and SLS22 may overlap the channel structures CH or may be located between the channel structures CH. In the plane, the second slit structures SLS21 and SLS22 may extend in the first direction I. In the cross section, the second slit structures SLS21 and SLS22 may extend in the third direction III. The second slit structures SLS21 and SLS22 may each have a smaller depth than the first slit structure SLS1. As an example, the second slit structure SLS21 may have a depth enough for passing through the conductive layers 11 corresponding to a drain select line among the conductive layers 11. The second slit structure SLS22 may have a depth enough for passing through the conductive layers 11 corresponding to a source select line among the conductive layers 11. The second slit structures SLS21 and SLS22 may each include a stressor for adjusting wafer warpage. As an example, the stressor may include a material having a tensile stress.

According to the structure described above, a wafer may include the gate structures GST and the first slit structure SLS1. The gate structures GST may be separated from each other by the first slit structure SLS1 extending in the first direction I, and the gate structure GST may extend in the first direction I. Therefore, stress in the first direction I may be different from stress in the second direction II, and bending, cracking, or the like may occur, or wafer warpage may occur. Accordingly, in order to reduce a stress, at least one of the first supporter SP1, the second supporter SP2, the first slit structure SLS1, and the second slit structures SLS21 and SLS22 may include a stressor. In an embodiment, by reducing a stress in a specific direction by the stressor, it is possible to prevent or reduce damage such as bending and cracking, and to reduce warpage of the semiconductor device.

FIG. 2A to FIG. 2D are diagrams illustrating the structure of a semiconductor device in accordance with an embodiment. Hereinafter, the content overlapping with the previously described content will be omitted.

Referring to FIG. 2A to FIG. 2D, the semiconductor device may include a gate structure GST and supporters SP_A to SP_D. The gate structure GST may include conductive layers and insulating layers that are alternately stacked. Some regions of the gate structure GST may include sacrificial layers instead of the conductive layers. The sacrificial layer may remain without being replaced with a conductive layer during a manufacturing process.

The supporters SP_A to SP_D may each have a multilayer structure including a stressor 22. The supporters SP_A to SP_D may each be the first supporter SP1 or the second supporter SP2 previously described with reference to FIG. 1A to FIG. 1D.

Figure 2A:
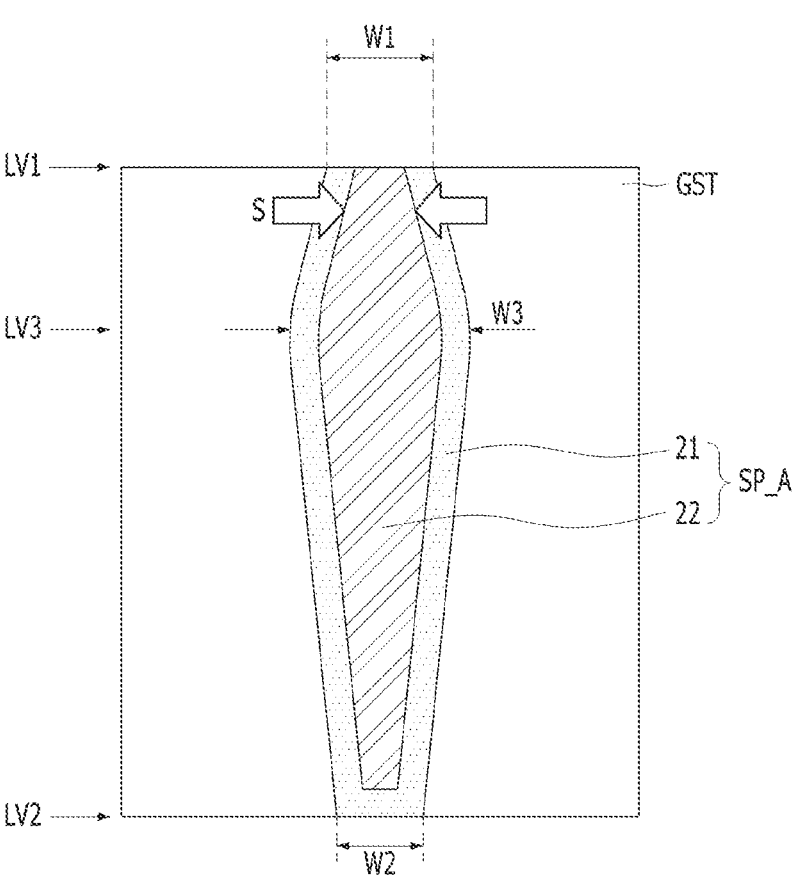
FIG. 2A, 2B, 2C, and FIG. 2D are diagrams illustrating the structure of a semiconductor device in accordance with an embodiment.

Referring to FIG. 2A, the supporter SP_A may be located in the gate structure GST. The supporter SP_A may have different widths according to levels and may have a bowing shape. In an embodiment, the bowing shape of the supporter SP_A is caused by different widths (i.e., W1, W2, and W3) at different levels (i.e., LV1, LV2, and LV3). For example, the widths (i.e., W1, W2, and W3) at the levels (i.e., LV1, LV2, and LV3) of the supporter SP_A provide a bowing shape of the supporter SP_A as shown in FIG. 2A. The supporter SP_A may have a first width W1 at a first level LV1, a second width W2 at a second level LV2, and a third width W3 at a third level LV3. The third level LV3 may be located between the first level LV1 and the second level LV2. The third width W3 may be greater than the first width W1 and the second width W2. As an example, the first level LV1 may be an upper part and the second level LV2 may be a lower part. Alternatively, the first level LV1 may be a lower part and the second level LV2 may be an upper part.

The support SP_A may be a multilayer in which material layers having different types of stress are combined. The "different types" may mean that directions in which stresses are applied are different or opposite to each other. The support SP_A may be a multilayer in which a material layer having a tensile stress and a material layer having a compressive stress are combined.

The supporter SP_A may include a first sealing layer 21 and a stressor 22. The stressor 22 may be located in the first sealing layer 21. The first sealing layer 21 may surround an outer wall and a bottom surface of the stressor 22. Alternatively, the first sealing layer 21 may be located in the stressor 22. The stressor 22 may surround an outer surface and a bottom surface of the first sealing layer 21.

The stressor 22 may have a stress of a different type from that of the first sealing layer 21. As an example, the stressor 22 may include a material having a tensile stress, and the first sealing layer 21 may include a material having a compressive stress. In an embodiment, the stressor 22 may apply stress S toward the center of the first supporter SP_A, which makes it possible to increase the support force of the supporter SP_A and reduce bending, cracking, or the like.

The first sealing layer 21 may include an insulating material such as oxide. The stressor 22 may include nitride, a low-k material, or a high-k material, or a combination thereof. The low-k material may include silicon carbon nitride (SiCN), silicon boron nitride (SiBN), or boron nitride (BN), or a combination thereof. The high-k material may include aluminum oxide (AlO$_x$) or hafnium oxide (HfO$_x$), or a combination thereof.

Figure 2B:
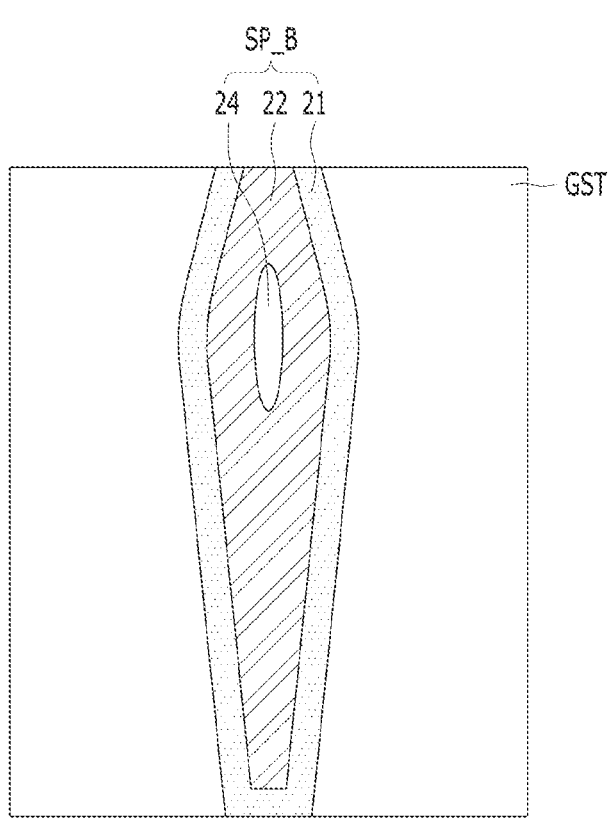

Referring to FIG. 2B, the supporter SP_B may include the first sealing layer 21, the stressor 22 and a void 24. The supporter SP_B may have different widths according to levels and may have a bowing shape. The void 24 may be located in the stressor 22. The void 24 may be an empty space not filled with a stressor material. The void 24 may be entirely located inside the stressor 22 or may be located at a specific level. In an embodiment, the void 24 may play a role of relieving stress, and bending, cracking, or the like may be reduced by the void 24.

Figure 2C:
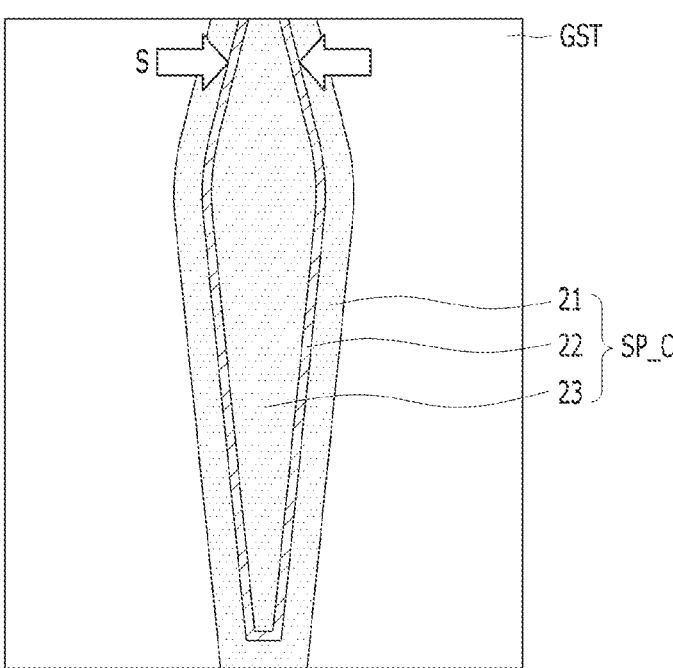

Referring to FIG. 2C, the supporter SP_C may include the first sealing layer 21, the stressor 22 and a second sealing layer 23. The supporter SP_C may have different widths according to levels and may have a bowing shape. The stressor 22 may be located between the first sealing layer 21 and the second sealing layer 23. As an example, the stressor 22 may be located in the first sealing layer 21 and the second sealing layer 23 may be located in the stressor 22.

The stressor 22 may have a stress of a different type from that of the first sealing layer 21, have a stress of a different type from that of the second sealing layer 23, or have a stress of a different type from those of the first sealing layer 21 and the second sealing layer 23. As an example, the stressor 22 may include a material having a tensile stress, and at least one of the first sealing layer 21 and the second sealing layer 23 may include a material having a compressive stress. The stressor 22 may apply the stress S from the first sealing layer 21 toward the second sealing layer 23. In an embodiment, the stress S is applied toward the center of the supporter SP_C by the stressor 22, which makes it possible to increase the support force of the supporter SP_C and reduce bending, cracking, or the like.

The first sealing layer 21 and the second sealing layer 23 may each include an insulating material. The first sealing layer 21 may be a first oxide layer, and the second sealing layer 23 may be a second oxide layer. The stressor 22 may include nitride, a low-k material, or a high-k material, or a combination thereof. As an example, the support SP_C may include a first oxide layer, a nitride layer within the first oxide layer, and a second oxide layer within the nitride layer. In an embodiment, the support SP_C may include a second oxide layer surrounded by first oxide layer and a nitride layer located between the first and second oxide layers.

Figure 2D:
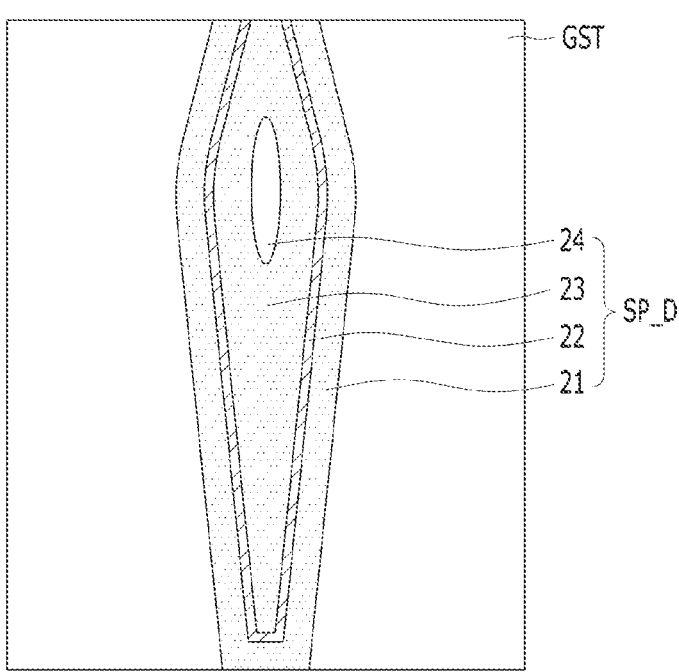

Referring to FIG. 2D, the supporter SP_D may include at least one of the first sealing layer 21, the stressor 22, the second sealing layer 23, and the void 24. The supporter SP_D may have different widths according to levels and may have a bowing shape. The void 24 may be located inside the second sealing layer 23. The void 24 may be entirely located inside the second sealing layer 23 or located at a specific level. In an embodiment, the void 24 may play a role of relieving stress, and bending, cracking, or the like may be reduced by the void 24.

According to the structure in an embodiment described above, it is possible to adjust an inter-layer stress by the supporters SP_A to SP_D each including the stressor 22, and to reduce wafer warpage. Materials, thicknesses, shapes, deposition conditions, and the like of the first sealing layer 21, the stressor 22, and the second sealing layer 23 may be determined in consideration of wafer warpage. As an example, the thickness of the stressor 22 may be 200 Å or less. At least one of the first sealing layer 21, the stressor 22, and the second sealing layer 23 may be formed by an atomic layer deposition (ALD) method or a low pressure chemical vapor deposition (CVD) method.

FIG. 3A to FIG. 3D are diagrams illustrating the structure of a semiconductor device in accordance with an embodiment. Hereinafter, the content overlapping with the previously described content will be omitted.

Referring to FIG. 3A to FIG. 3D, the semiconductor device may include a gate structure GST and slit structures SLS_A to SLS_D. The gate structure GST may include conductive layers and insulating layers that are alternately stacked. Some regions of the gate structure GST may include sacrificial layers instead of conductive layers. The sacrificial layer may remain without being replaced with a conductive layer during a manufacturing process.

The slit structures SLS_A to SLS_D may each have a multilayer structure including a stressor 32. The slit structures SLS_A to SLS_D may each be the first slit structure SLS1 or the second slit structures SLS21 and SLS22 previously described with reference to FIG. 1A to FIG. 1D.

Figure 3A:
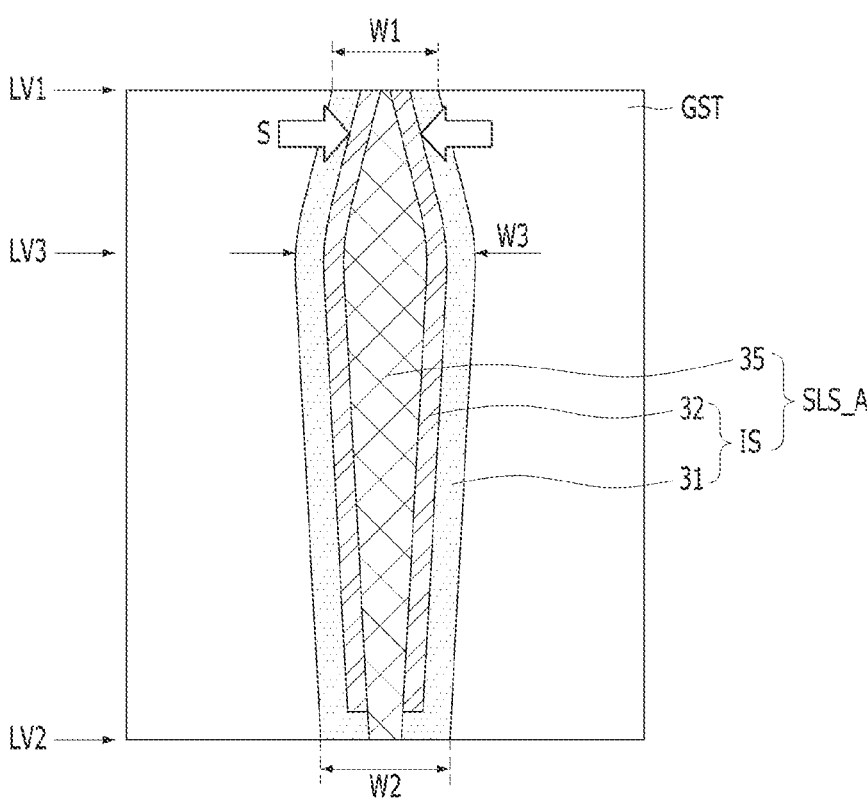
FIG. 3A, 3B, 3C, and FIG. 3D are diagrams illustrating the structure of a semiconductor device in accordance with an embodiment.

Referring to FIG. 3A, the slit structure SLS_A may be located in the gate structure GST. The slit structure SLS_A may have different widths according to levels and may have a bowing shape. In an embodiment, the bowing shape of the slit structure SLS_A is caused by different widths (i.e., W1, W2, and W3) at different levels (i.e., LV1, LV2, and LV3). For example, the widths (i.e., W1, W2, and W3) at the levels (i.e., LV1, LV2, and LV3) of the slit structure SLS_A provide a bowing shape of the slit structure SLS_A as shown in FIG. 3A. The slit structure SLS_A may have a first width W1 at a first level LV1, a second width W2 at a second level LV2, and a third width W3 at a third level LV3. The third level LV3 may be located between the first level LV1 and the second level LV2. The third width W3 may be greater than the first width W1 and the second width W2.

The slit structure SLS_A may include a source contact plug 35 and an insulating spacer IS. The source contact plug 35 may include polysilicon, or metal such as titanium (Ti), tungsten (W), or molybdenum (Mo), or a combination thereof. The source contact plug 35 may be a single layer or a multilayer.

The insulating spacer IS may surround sidewalls of the source contact plug 35. The insulating spacer IS may be a multilayer in which material layers having different types of stress are combined. The insulating spacer IS may be a multilayer in which a material layer having a tensile stress and a material layer having a compressive stress are combined.

The insulating spacer IS may include a first sealing layer 31 and a stressor 32. The stressor 32 may be located in the first sealing layer 31. The first sealing layer 31 may surround an outer wall of the stressor 32. Alternatively, the first sealing layer 31 may be located in the stressor 32. The stressor 32 may surround an outer wall of the first sealing layer 31.

The stressor 32 may have a stress of a different type from that of the first sealing layer 31. As an example, the stressor 32 may include a material having a tensile stress, and the first sealing layer 31 may include a material having a compressive stress. In an embodiment, the stressor 32 may apply stress S toward the center of the slit structure SLS_A, which makes it possible to increase the support force of the slit structure SLS_A and reduce bending, cracking, or the like.

The first sealing layer 31 may include an insulating material such as oxide. The stressor 32 may include nitride, a low-k material, or a high-k material, or a combination thereof. The low-k material may include silicon carbon nitride (SiCN), silicon boron nitride (SiBN), or boron nitride (BN), or a combination thereof. The high-k material may include aluminum oxide ($AlO_x$) or hafnium oxide ($HfO_x$), or a combination thereof.

Figure 3B:
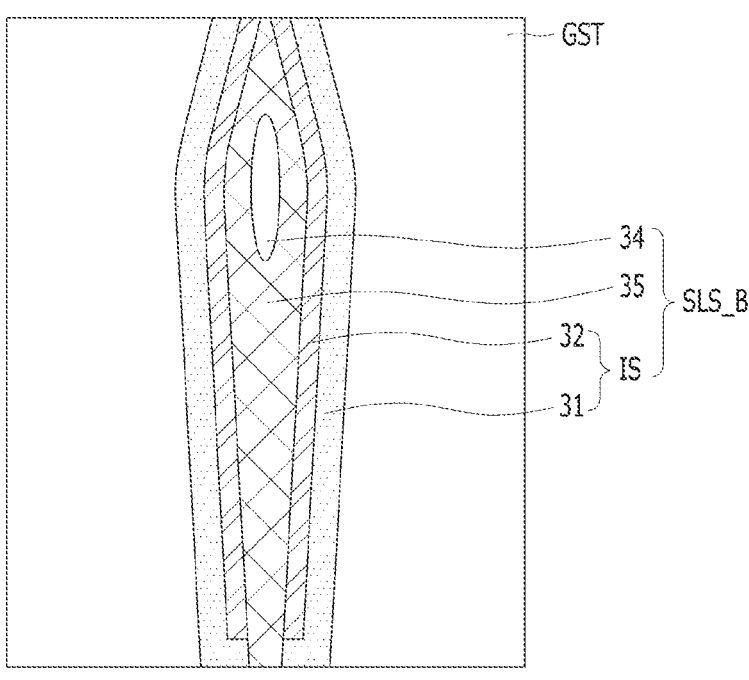

Referring to FIG. 3B, the slit structure SLS_B may include the source contact plug 35 and the insulating spacer IS. The slit structure SLS_B may have different widths according to levels and may have a bowing shape. The insulating spacer IS may include the first sealing layer 31 and the stressor 32. A void 34 may be located in the source contact plug 35. The void 34 may be entirely located inside the source contact plug 35 or may be located at a specific level. In an embodiment, the void 34 may play a role of relieving stress, and bending, cracking, or the like may be reduced by the void 34.

Figure 3C:
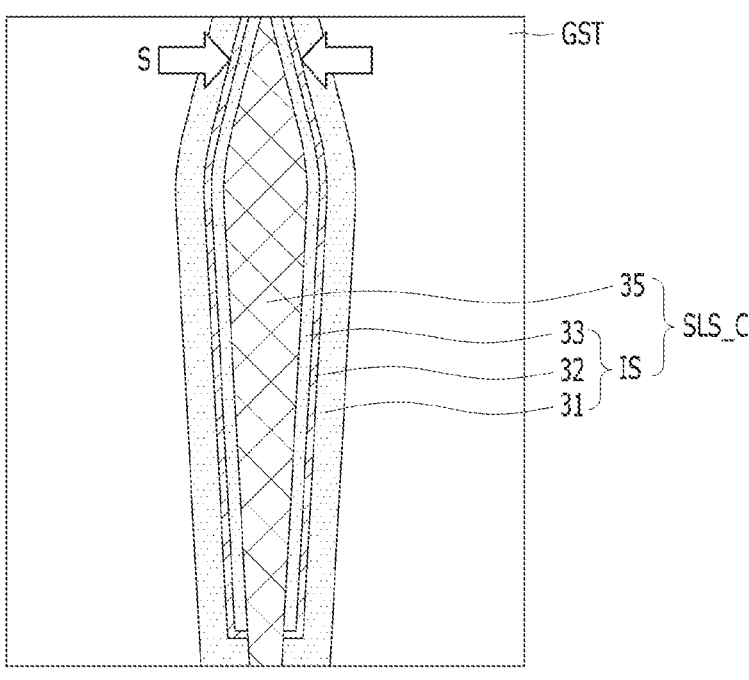

Referring to FIG. 3C, the slit structure SLS_C may include the source contact plug 35 and the insulating spacer IS. The slit structure SLS_C may have different widths according to levels and may have a bowing shape. The insulating spacer IS may include the first sealing layer 31, the stressor 32 and a second sealing layer 33. The stressor 32 may be located between the first sealing layer 31 and the second sealing layer 33. As an example, the stressor 32 may be located in the first sealing layer 31 and the second sealing layer 33 may be located in the stressor 32.

The stressor 32 may have a stress of a different type from that of the first sealing layer 31, have a stress of a different type from that of the second sealing layer 33, or have a stress of a different type from those of the first sealing layer 31 and the second sealing layer 33. As an example, the stressor 32 may include a material having a tensile stress, and at least one of the first sealing layer 31 and the second sealing layer 33 may include a material having a compressive stress. The stressor 32 may apply stress S from the first sealing layer 31 toward the second sealing layer 33. In an embodiment, the stress S is applied toward the center of the slit structure SLS_C by the stressor 32, which makes it possible to increase the support force of the slit structure SLS_C and reduce bending, cracking, or the like.

The first sealing layer 31 and the second sealing layer 33 may each include an insulating material. The first sealing layer 31 may be a first oxide layer, and the second sealing layer 33 may be a second oxide layer. The stressor 32 may include nitride, a low-k material, or a high-k material, or a combination thereof. In an embodiment, the slit structure SLS_C may include a second oxide layer surrounded by first oxide layer and a nitride layer located between the first and second oxide layers.

Figure 3D:
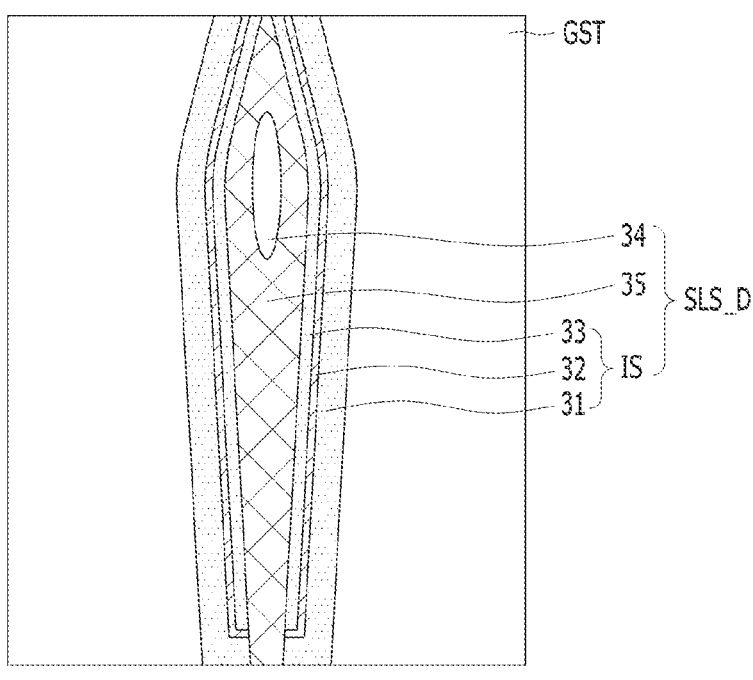

Referring to FIG. 3D, the slit structure SLS_D may include the source contact plug 35 and the insulating spacer IS. The slit structure SLS_D may have different widths according to levels and may have a bowing shape. The insulating spacer IS may include at least one of the first sealing layer 31, the stressor 32, and the second sealing layer 33. The void 34 may be located in the source contact plug 35. The void 34 may be located inside the source contact plug 35. The void 34 may be entirely located inside the source contact plug 35 or may be located at a specific level. In an embodiment, the void 34 may play a role of relieving stress, and bending, cracking, or the like may be reduced by the void 34.

According to the structure of an embodiment described above, it is possible to adjust an inter-layer stress by the slit structures SLS_A to SLS_D each including the stressor 32, and to reduce wafer warpage. Materials, thicknesses, shapes, deposition conditions, and the like of the first sealing layer 31, the stressor 32, and the second sealing layer 33 may be determined in consideration of wafer warpage. As an example, the thickness of the stressor 32 may be 200 Å or less. At least one of the first sealing layer 31, the stressor 32, and the second sealing layer 33 may be formed by an atomic layer deposition (ALD) method or a low pressure chemical vapor deposition (CVD) method.

The slit structures SLS_A to SLS_D may have structures similar to those of the supporters SP_A to SP_D previously described with reference to FIG. 2A to FIG. 2D, or a structure obtained by combining those in the above-described embodiments.

FIG. 4A to FIG. 4E are diagrams illustrating the structure of a semiconductor device in accordance with an embodiment. Hereinafter, the content overlapping with the previously described content will be omitted.

Figure 4A:
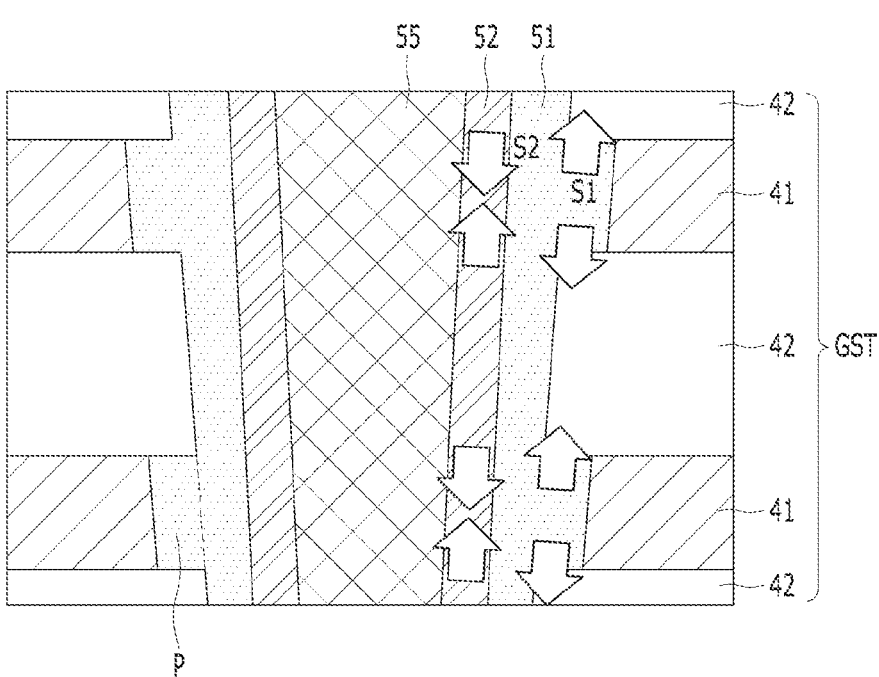
FIG. 4A, 4B, 4C, 4D, and FIG. 4E are diagrams illustrating the structure of a semiconductor device in accordance with an embodiment.

Referring to FIG. 4A, the semiconductor device may include a gate structure GST, a first sealing layer 51, a stressor 52, or a source contact plug 55, or a combination thereof. The gate structure GST may include conductive layers 41 and insulating layers 42 that are alternately stacked. The first sealing layer 51, the stressor 52, or the source contact plug 55 may constitute a supporter or a slit structure. Although not illustrated in this drawing, the semiconductor device may further include a second sealing layer, a void, and the like.

The stressor 52 may be located in the first sealing layer 51. The first sealing layer 51 and the stressor 52 may have stresses in different directions. The first sealing layer 51 may have a compressive stress S1, and the stressor 52 may have a tensile stress S2. In an embodiment, the first sealing layer 51 and the stressor 52 having different types of stresses may be combined, which makes it possible to strengthen the support force of the supporter or the slit structure and reduce wafer warpage.

The first sealing layer 51 may include one or more protrusions P on an outer wall thereof. The protrusions P may be located to correspond to the conductive layers 41. Due to the protrusions P, the first sealing layer 51 may have a relatively great thickness in portions corresponding to the conductive layers 41. Accordingly, in an embodiment, even though gas remains inside the conductive layer 41 during the process of forming the conductive layers 41, it is possible to prevent or reduce damage to a peripheral layer caused by diffusion of the remaining gas.

Figure 4B:
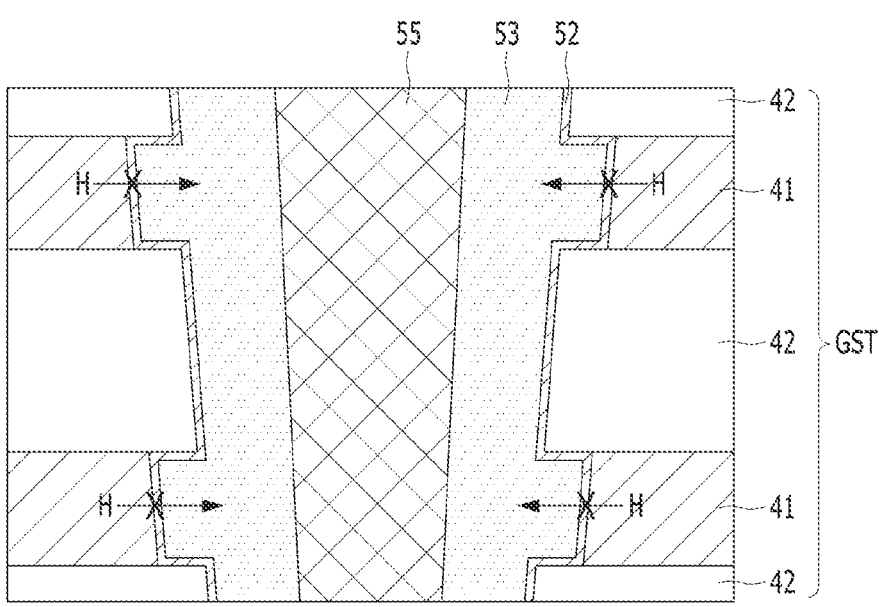

Referring to FIG. 4B, the semiconductor device may include the gate structure GST, the stressor 52, the second sealing layer 53, or the source contact plug 55, or a combination thereof. The second sealing layer 53 may be located in the stressor 52. The stressor 52 may be used as a diffusion barrier. Outgassing of hydrogen (H) included in the conductive layers 41 may be prevented or reduced. Accordingly, hydrogen passivation of a cell region can be enhanced and current flow can be improved.

Figure 4C:
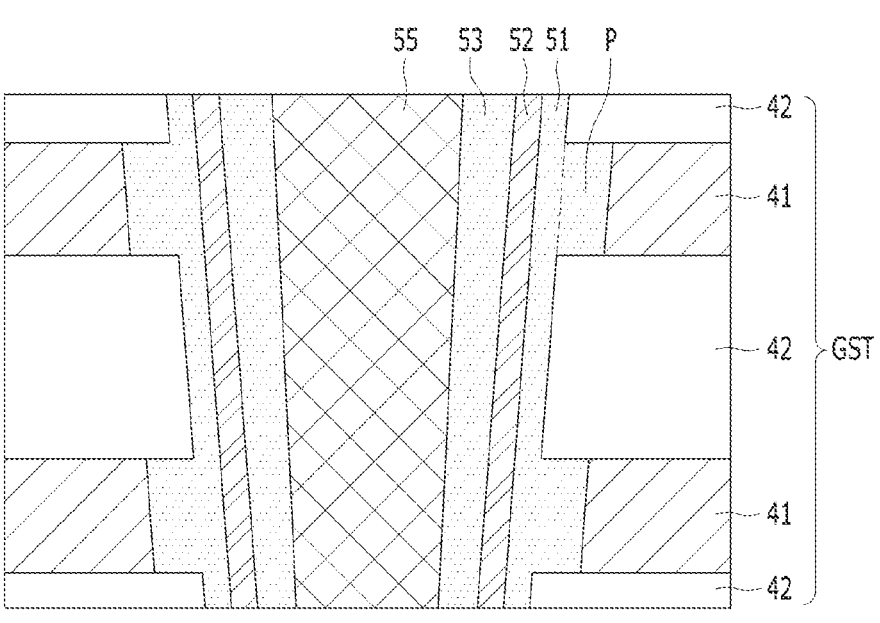

Referring to FIG. 4C, the semiconductor device may include the gate structure GST, the first sealing layer 51, the stressor 52, the second sealing layer 53, or the source contact plug 55, or a combination thereof. The stressor 52 may be located in the first sealing layer 51, the second sealing layer 53 may be located in the stressor 52, and the source contact plug 55 may be located in the second sealing layer 53.

Sidewalls of the conductive layers 41 and the insulating layers 42 may be aligned or offset. When the sidewalls are offset, at least one of the first sealing layer 51, the stressor 52, the second sealing layer 53, and the source contact plug 55 may include one or more protrusions P on an outer wall thereof.

Figure 4D:
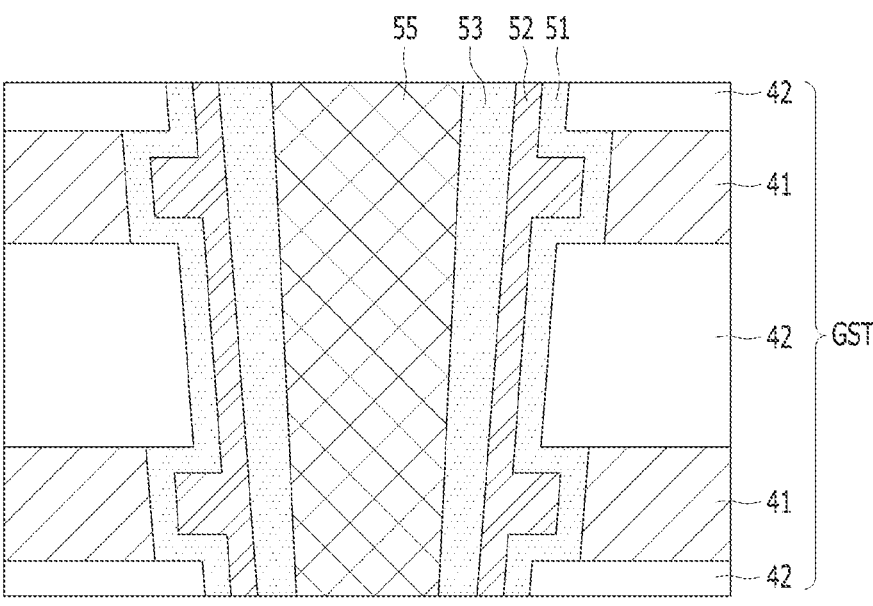
Figure 4E:
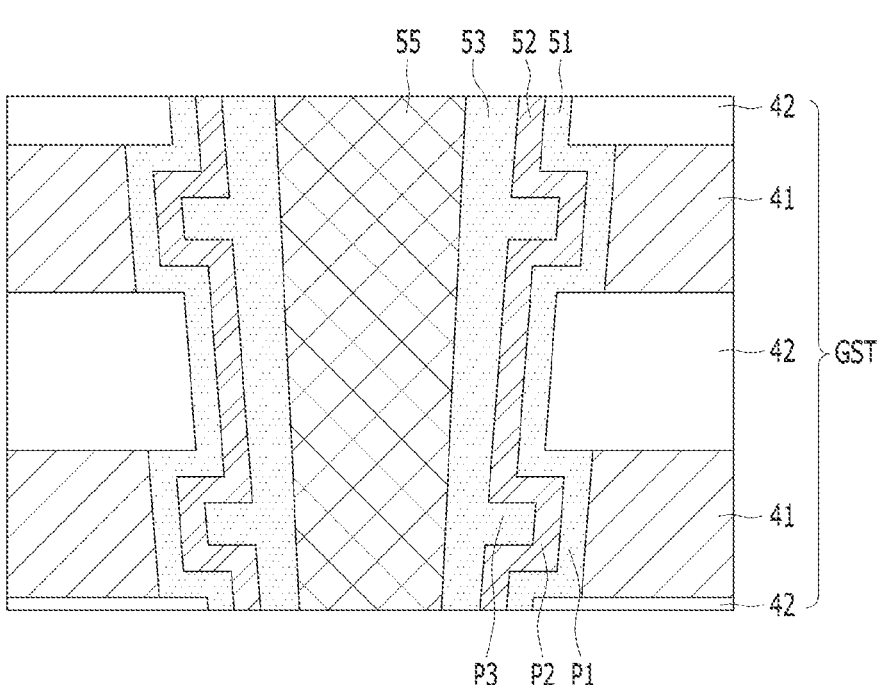

Depending on the thicknesses of the first sealing layer 51, the stressor 52, and the second sealing layer 53, the shape, location, and the like of the protrusion P may be changed. Referring to FIG. 4D, the first sealing layer 51 may include at least one first protrusion P1, the stressor 52 may include at least one second protrusion P2, and the second sealing layer 53 may have a flat outer wall. Referring to FIG. 4E, the first sealing layer 51 may include at least one first protrusion P1, the stressor 52 may include at least one second protrusion P2, and the second sealing layer 53 may include at least one third protrusion P3.

According to the structure in an embodiment described above, it is possible to reduce wafer warpage by the multi-layer structure of the supporter or the slit structure. In an embodiment, it is also possible to prevent or reduce damage to a peripheral layer caused by gas remaining in the conductive layers 41, and to improve a cell current by reducing outgassing of hydrogen.

FIG. 5A to FIG. 5D are diagrams for explaining a manufacturing method of a semiconductor device in accordance with an embodiment. Hereinafter, the content overlapping with the previously described content will be omitted.

Figure 5A:
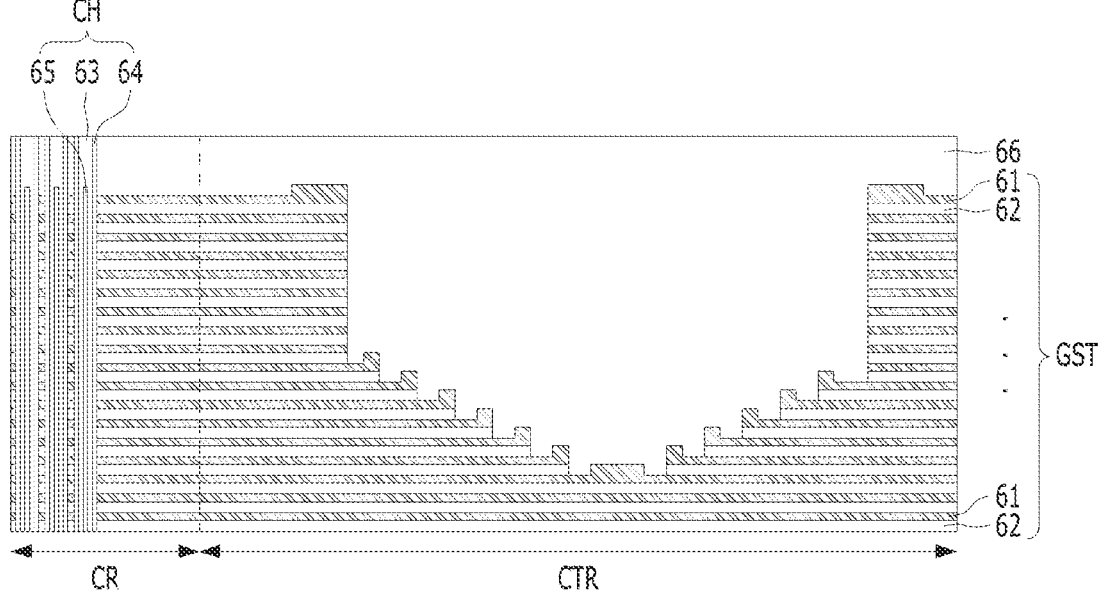
FIG. 5A, 5B, 5C, and FIG. 5D are diagrams for describing a manufacturing method of a semiconductor device in accordance with an embodiment.

Referring to FIG. 5A, a stack ST may be formed on a lower structure such as a substrate, a peripheral circuit, an interconnection structure, and a source structure. The stack ST may include a cell region CR and a contact region CTR. The stack ST may include first material layers 61 and second material layers 62 that are alternately stacked. The first material layers 61 may each include a material having a high etching selectivity with respect to the second material layers 62. For example, the first material layers 61 may each include a sacrificial material for forming a gate line, and the second material layers 62 may each include an insulating material. As another example, the first material layers 61 may each include a conductive material for a gate line, and the second material layers 62 may each include an insulating material.

Subsequently, channel structures CH may be formed in the cell region CR of the stack ST. The channel structure CH may include a channel layer 63. The channel layer 63 may include a semiconductor material such as silicon (Si) or germanium (Ge). The channel structure CH may further include a memory layer 64 surrounding the channel layer 63 or an insulating core 65 within the channel layer 63, or a combination thereof. The memory layer 64 may include a blocking layer, a data storage layer, or a tunneling layer, or a combination thereof. The data storage layer may include a floating gate, polysilicon, a charge trap material, nitride, or a variable resistance material, or a combination thereof. The semiconductor device may also include an electrode structure instead of the channel structure CH. The electrode structure may include an electrode layer, and may include a variable resistance material that surrounds an inner wall or an outer wall of the electrode layer.

Subsequently, the contact region CTR of the stack ST may be patterned in a step shape. Through this, at least one step structure for exposing the first material layers 61 may be formed. An exposed portion of the first material layer 61 may be used as a pad for a gate line and may have a greater thickness than the remaining portion. An additional process for increasing the thickness of the portion of the first material layer 61 corresponding to the pad may be performed. Subsequently, an interlayer dielectric layer 66 may be formed on the stack ST.

Figure 5B:
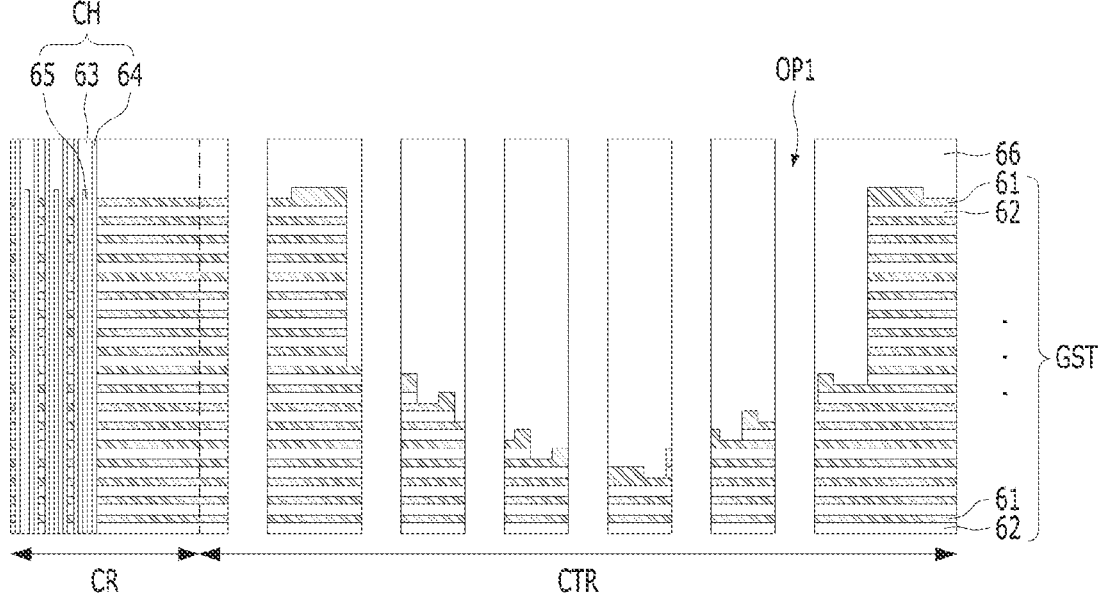

Referring to FIG. 5B, a first opening OP1 may be formed in the contact region CTR of the stack ST. The first opening OP1 may extend into the stack ST through the interlayer dielectric layer 66. In a plane, the first opening OP1 may have a circular shape, an elliptical shape, a polygonal shape, or a linear shape, or a combination thereof. In a cross section, the first opening OP1 may have a bowing shape. In an embodiment, when forming the first opening OP1, it is also possible to form a contact hole connected to a peripheral circuit or an interconnection structure located below the stack ST.

Figure 5C:
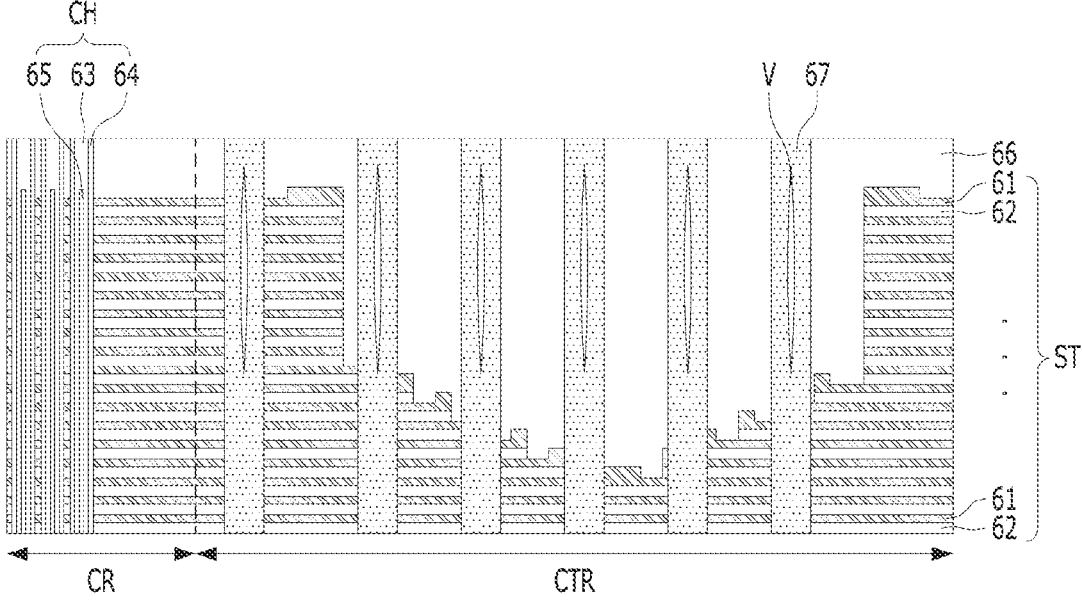

Referring to FIG. 5C, a supporter 67 may be formed in the first opening OP1. The supporter 67 may include a stressor. As an example, the supporter 67 may include a first sealing layer, a stressor, or a second sealing layer, or a combination thereof. The supporter 67 may further include a void V. The first sealing layer may be a first oxide layer and the second sealing layer may be a second oxide layer. The stressor may include a material having a tensile stress.

Figure 5D:
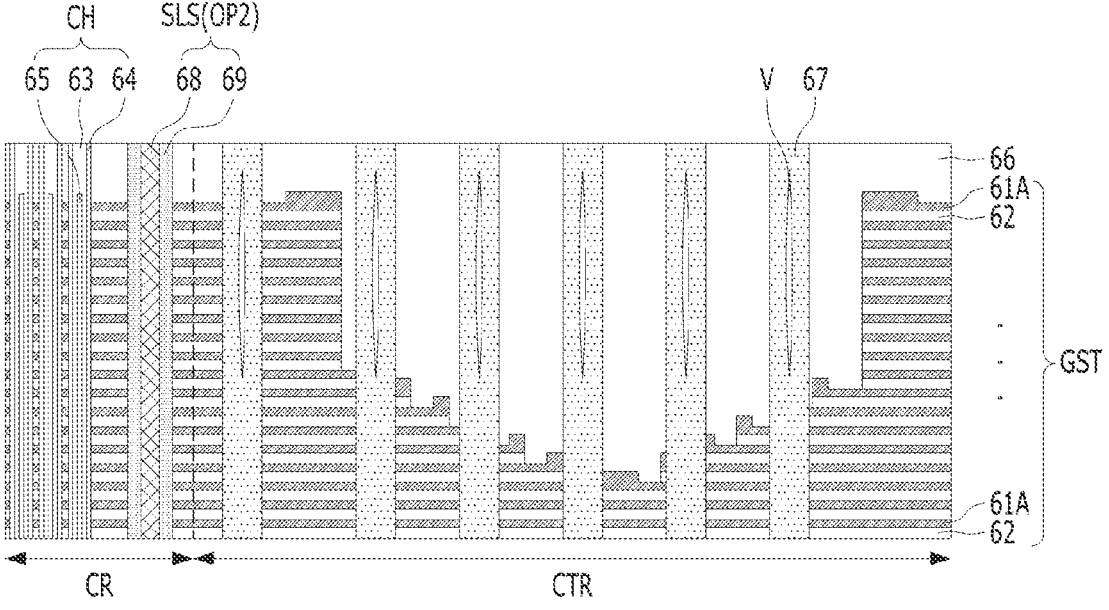

Referring to FIG. 5D, a second opening OP2 may be formed in the cell region CR of the stack ST. In the plane, the second opening OP2 may extend from the cell region CR to the contact region CTR. In the cross section, the second opening OP2 may have a bowing shape.

Subsequently, the first material layers 61 may be replaced with third material layers 61A through the second opening OP2. For example, when the first material layers 61 each include a sacrificial material, the first material layers 61 may be removed and conductive layers may be respectively formed in regions where the first material layers 61 have been removed. The conductive layers may each include metal such as tungsten (W) and molybdenum (Mo). As another example, when the first material layers 61 each include a conductive material, a silicidation process or the like may be performed to lower the resistance of the first material layers 61. Thus, a gate structure GST including the third material layers 61A and the second material layers 62 that are alternately stacked may be formed.

When the source structure located below the stack ST includes a source sacrificial layer, a process for connecting the channel structure CH and the source structure may be additionally performed. As an example, the source sacrificial layer may be removed through the second opening OP2, and a source layer may be formed in a region where the source sacrificial layer has been removed. The source layer may be connected to the channel layer 63 by passing through the memory layer 64.

Subsequently, a slit structure SLS may be formed in the second opening OP2. The slit structure SLS may include a source contact plug 68 or an insulating spacer 69, or a combination thereof. The source contact plug 68 may extend through the gate structure GST and be connected to a lower structure such as a source structure. The insulating spacer 69 may include a stressor. As an example, the insulating spacer 69 may include a first sealing layer, a stressor, or a second sealing layer, or a combination thereof. The first sealing layer may be a first oxide layer and the second sealing layer may be a second oxide layer. The stressor may include a material having a tensile stress. The source contact plug 68 may include a void.

The slit structure SLS may correspond to the first slit structure SLS1 of the embodiment previously described with reference to FIG. 1A to FIG. 1D. The second slit structures SLS21 and SLS22 of FIG. 1A may be formed in the process of forming the stack ST or may be formed after the stack ST is formed. As an example, after a first stack ST1 for source select lines is formed and the second slit structure SLS22 is formed in the first stack ST1, a second stack for word lines and drain select lines may be formed. After the stack ST is formed, the second slit structure SLS21 passing through the drain select lines (or a first material layer for drain select lines) may be formed. The second slit structures SLS21 and SLS22 may each include a stressor.

According to an embodiment of the manufacturing method described above, it is possible to form the supporter 67 or the slit structure SLS including a stressor. Accordingly, in an embodiment, it is possible to prevent or mitigate bending, cracking, or the like of the gate structure GST and reduce wafer warpage.

Figure 6A:
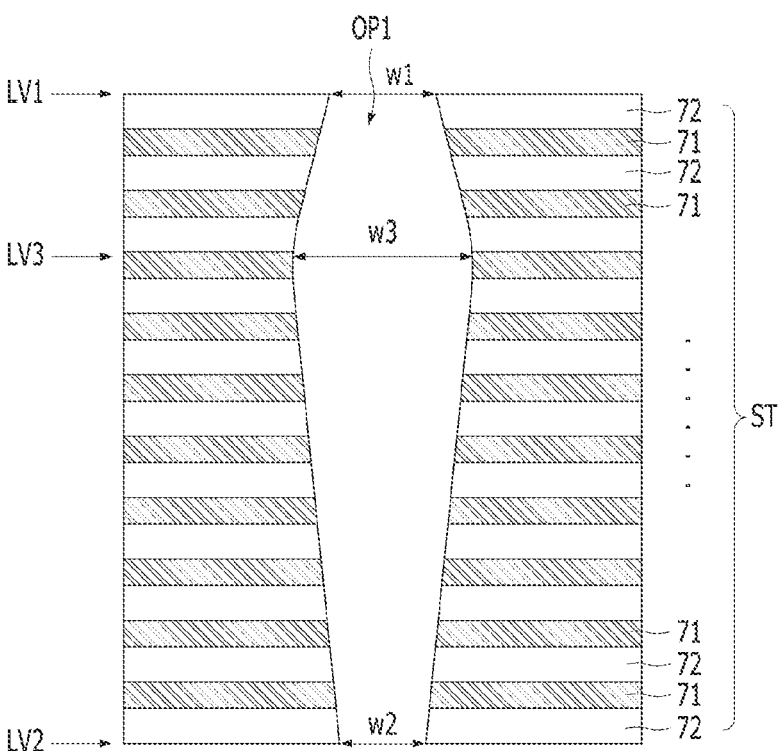
FIG. 6A and FIG. 6B are diagrams for describing a manufacturing method of a semiconductor device in accordance with an embodiment.
Figure 6B:
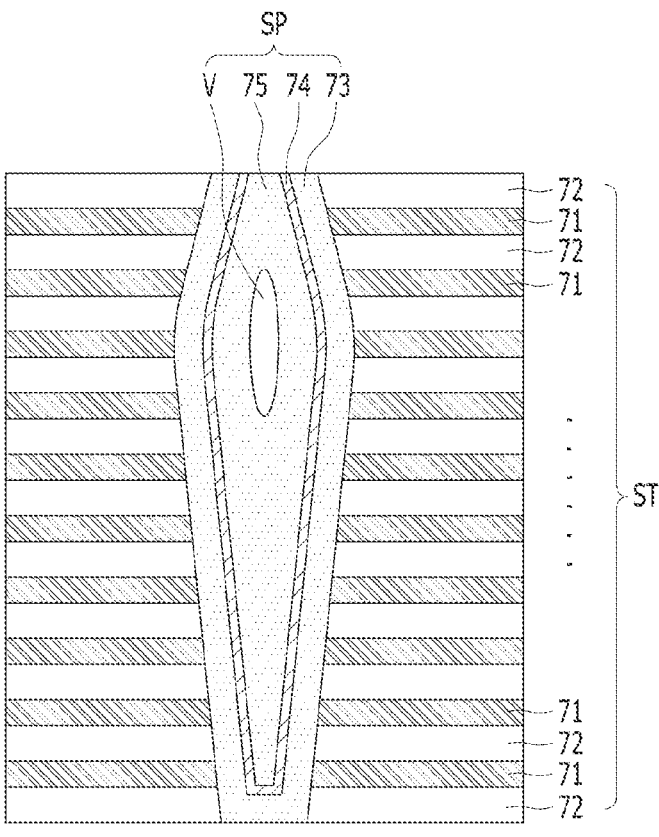

FIG. 6A and FIG. 6B are diagrams for explaining a manufacturing method of a semiconductor device in accordance with an embodiment. Hereinafter, the content over-lapping with the previously described content will be omit-ted.

Referring to FIG. 6A, a stack ST including first material layers 71 and second material layers 72 that are alternately stacked may be formed. Subsequently, a first opening OP1 may be formed in the stack ST. The first opening OP1 may have a bowing shape. The first opening OP1 may have a first width W1 at a first level LV1, a second width W2 at a second level LV2, and a third width W3 at a third level LV3. The third level LV3 may be located between the first level LV1 and the second level LV2. The third width W3 may be greater than the first width W1 and the second width W2. As an example, the first level LV1 may be an upper part and the second level LV2 may be a lower part. Alternatively, the first level LV1 may be a lower part and the second level LV2 may be an upper part.

Referring to FIG. 6B, a supporter SP may be formed in the first opening OP1. The supporter SP may include a first sealing layer 73, a stressor 74, a second sealing layer 75, or a void V, or a combination thereof. As an example, the first sealing layer 73 may be formed in the first opening OP1, the stressor 74 may be formed in the first sealing layer 73, and the second sealing layer 75 may be formed in the stressor 74.

The first sealing layer 73 may be formed using a low temperature process. As an example, the first sealing layer 73 may be formed by depositing an oxide layer through a low temperature process of about 650° C. or less. The first sealing layer 73 may be formed by an ALD method, and may have a thickness of about 300 Å or less. The first sealing layer 73 may include a material having a compressive stress. As an example, the first sealing layer 73 may include oxide.

The stressor 74 may be formed using a low temperature process. As an example, the stressor 74 may be formed by depositing an oxide layer through a low temperature process of about 650° C. or less. The stressor 74 may be formed by an ALD method. The stressor 74 may have substantially the same thickness as or a different thickness from the first sealing layer 73. As an example, the stressor 74 may have a smaller thickness than the first sealing layer 73, and may have a thickness of about 200 Å or less.

The stressor 74 may include a material having a tensile stress. The stressor 74 may include nitride, a low-k material, or a high-k material, or a combination thereof. The low-k material may include silicon carbon nitride (SiCN), silicon boron nitride (SiBN), or boron nitride (BN), or a combination thereof. The high-k material may include aluminum oxide ($AlO_x$) or hafnium oxide ($HfO_x$), or a combination thereof.

The second sealing layer 75 may be formed using a low temperature process. As an example, the second sealing layer 75 may be formed by depositing an oxide layer through a low temperature process of about 650° C. or less. The second sealing layer 75 may be formed by an ALD method or a CVD method, and may have a thickness of about 500 Å or less. The second sealing layer 75 may include a void V therein. The second sealing layer 75 may include a material having a compressive stress. As an example, the second sealing layer 75 may include oxide.

According to an embodiment of the manufacturing method described above, it is possible to form the supporter SP including the stressor 74. Accordingly, in an embodiment, it is possible to prevent or mitigate bending, cracking, or the like of the gate structure GST and reduce wafer warpage.

Figure 7A:
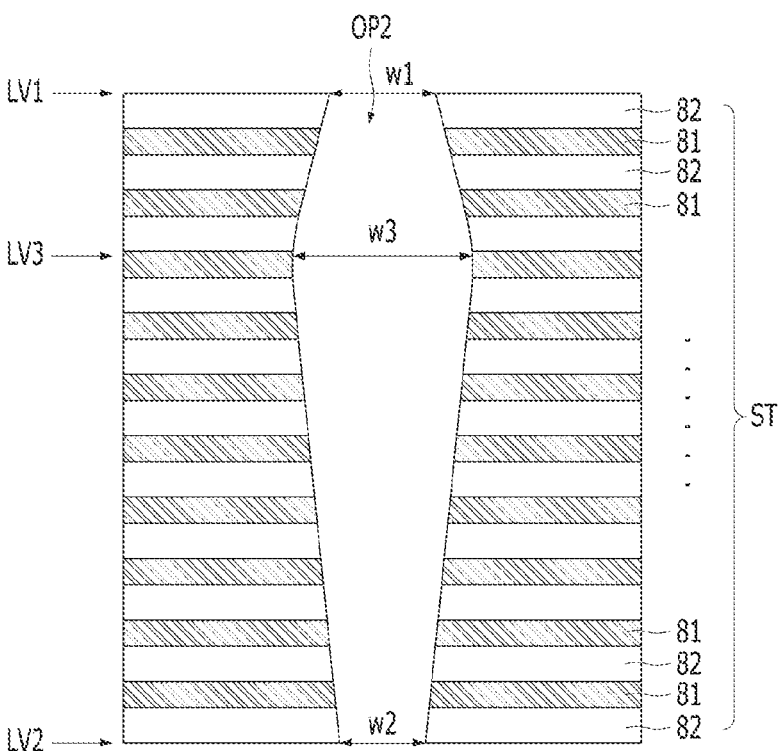
FIG. 7A, 7B, and FIG. 7C are diagrams for describing a manufacturing method of a semiconductor device in accordance with an embodiment.
Figure 7B:
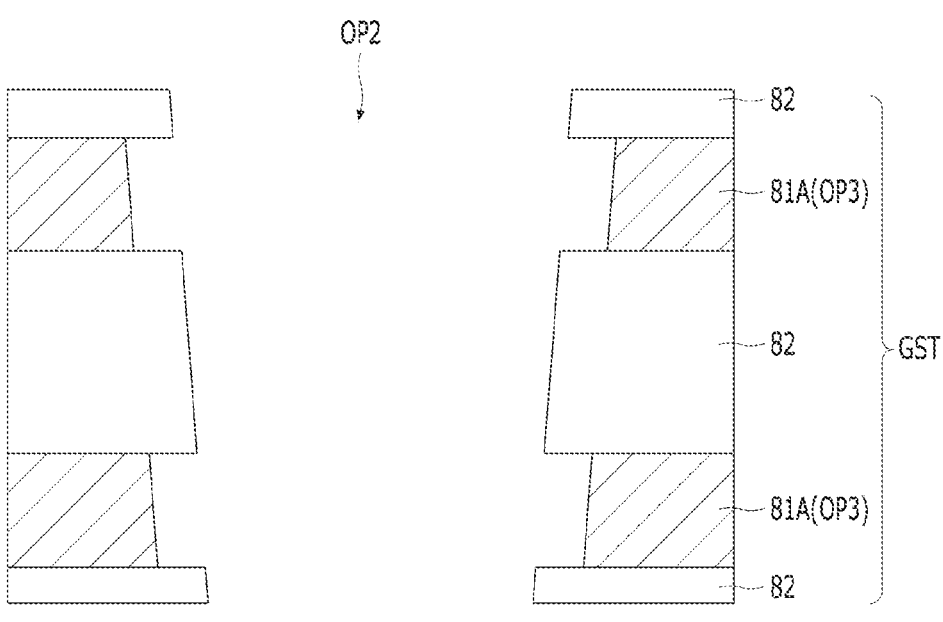
Figure 7C:
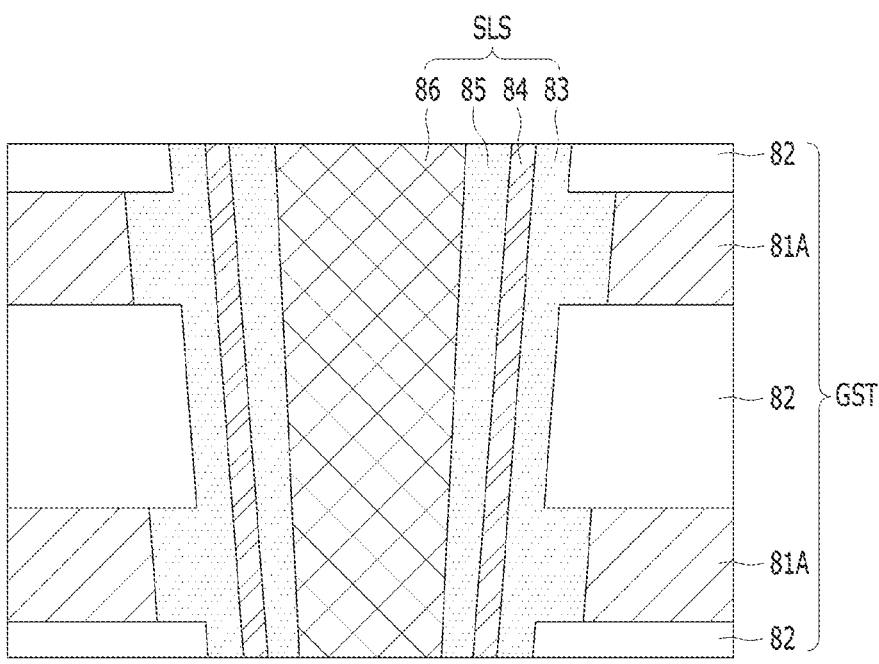

FIG. 7A to FIG. 7C are diagrams for explaining a manu-facturing method of a semiconductor device in accordance with an embodiment. Hereinafter, the content overlapping with the previously described content will be omitted.

Referring to FIG. 7A, a stack ST including first material layers 81 and second material layers 82 that are alternately stacked may be formed. Subsequently, a second opening OP2 may be formed in the stack ST. The second opening OP2 may have a bowing shape. The second opening OP2 may have a first width W1 at a first level LV1, may have a second width W2 at a second level LV2, and may have a third width W3 at a third level LV3. The third level LV3 may be located between the first level LV1 and the second level LV2. The third width W3 may be greater than the first width W1 and the second width W2. As an example, the first level LV1 may be an upper part and the second level LV2 may be a lower part. Alternatively, the first level LV1 may be a lower part and the second level LV2 may be an upper part.

Referring to FIG. 7B, the first material layers 81 may be replaced with third material layers 81A through the second opening OP2. As an example, third openings OP3 may be formed by removing the first material layers 81. Subse-quently, a conductive layer may be formed to fill the third openings OP3. The conductive layer may be formed by a deposition method, and may be deposited in the third openings OP3 and the second openings OP2. A portion of the conductive layer formed in the second opening OP2 may be etched to form mutually separated third material layers 81A. Thus, a gate structure GST including the third material layers 81A and the second material layers 82 that are alternately stacked may be formed. When the conductive layer is etched, portions formed in the third openings OP3 may also be partially etched. Accordingly, irregularities may be formed on an inner wall of the second opening OP2. The second material layers 82 may protrude into the second opening OP2 compared to the third material layers 81A.

Referring to FIG. 7C, a slit structure SLS may be formed in the second opening OP2. The slit structure SLS may include a first sealing layer 83, a stressor 84, a second sealing layer 85, or a source contact plug 86, or a combi-nation thereof. The source contact plug 86 may include a void.

As an example, the first sealing layer 83 may be formed in the second opening OP2, the stressor 84 may be formed in the first sealing layer 83, and the second sealing layer 85 may be formed in the stressor 84. Subsequently, the source contact plug 86 may be formed in the second sealing layer 85. The source contact plug 86 may be electrically con-nected to a source structure by passing through the second sealing layer 85, the stressor 84, and the first sealing layer 83. At least one of the first sealing layer 83, the stressor 84, the second sealing layer 85, and the source contact plug 86 may include a protrusion onto which the irregularities of the second opening OP2 are transferred.

The first sealing layer 83 may be formed using a low temperature process. As an example, the first sealing layer 83 may be formed by depositing an oxide layer through a low temperature process of about 650° C. or less. The first sealing layer 83 may be formed by an ALD method, and may have a thickness of about 300 Å or less. The first sealing layer 83 may include a material having a compressive stress. As an example, the first sealing layer 83 may include oxide.

The stressor 84 may be formed using a low temperature process. As an example, the stressor 84 may be formed by depositing an oxide layer through a low temperature process of about 650° C. or less. The stressor 84 may be formed by an ALD method. The stressor 84 may have substantially the same thickness as or a different thickness from the first sealing layer 83. As an example, the stressor 84 may have a smaller thickness than the first sealing layer 83, and may have a thickness of about 200 Å or less.

The stressor 84 may include a material having a tensile stress. The stressor 84 may include nitride, a low-k material, or a high-k material, or a combination thereof. The low-k material may include silicon carbon nitride (SiCN), silicon boron nitride (SiBN), or boron nitride (BN), or a combination thereof. The high-k material may include aluminum oxide ($AlO_x$) or hafnium oxide ($HfO_x$), or a combination thereof.

The second sealing layer 85 may be formed using a low temperature process. As an example, the second sealing layer 85 may be formed by depositing an oxide layer through a low temperature process of about 650° C. or less. The second sealing layer 85 may be formed by an ALD method or a CVD method, and may have a thickness of about 500 Å or less. The second sealing layer 85 may include a void V therein. The second sealing layer 85 may include a material having a compressive stress. As an example, the second sealing layer 85 may include oxide.

According to an embodiment of the manufacturing method described above, it is possible to form a slit structure SLS including the stressor 84. Accordingly, in an embodiment, it is possible to prevent or mitigate bending, cracking, or the like of the gate structure GST and reduce wafer warpage.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:
a first gate structure including a cell region and a contact region;
a channel structure located in the cell region of the first gate structure; and
a supporter located in the contact region of the first gate structure,
wherein the supporter comprises:
a first oxide layer;
a first nitride layer in the first oxide layer; and
a second oxide layer in the first nitride layer, and
wherein the supporter comprises a bowing shape.

2. The semiconductor device of claim 1, wherein the second oxide layer includes a void therein.

3. The semiconductor device of claim 1, wherein the supporter has a first width at a first level, has a second width at a second level, and has a third width at a third level located between the first level and the second level, the third width being greater than the first width and the second width.

4. The semiconductor device of claim 1, wherein the supporter has substantially at least one of a circular shape, an elliptical shape, a polygonal shape, and a line shape in a plane.

5. The semiconductor device of claim 1, further comprising:
a second gate structure; and a slit structure located between the first gate structure and the second gate structure,
wherein the slit structure comprises:
a third oxide layer;
a second nitride layer in the third oxide layer; and
a fourth oxide layer in the second nitride layer, and
wherein the slit structure extends from the cell region to the contact region.

6. The semiconductor device of claim 5, wherein the slit structure has a bowing shape in a cross section.

7. The semiconductor device of claim 5, wherein at least one of the third oxide layer, the second nitride layer, and the fourth oxide layer includes a protrusion on an outer wall thereof.

8. The semiconductor device of claim 5, wherein the slit structure includes a source contact plug located in the fourth oxide layer.

9. The semiconductor device of claim 8, wherein the source contact plug includes a void therein.

10. A semiconductor device comprising:
a first gate structure including a cell region and a contact region;
a channel structure located in the cell region of the first gate structure; and
a supporter located in the contact region of the first gate structure,
wherein the supporter comprises:
a first sealing layer;
a first stressor in the first sealing layer; and
a second sealing layer in the first stressor, and
wherein the supporter has a first width at a first level, has a second width at a second level, and has a third width at a third level located between the first level and the second level, the third width being greater than the first width and the second width.

11. The semiconductor device of claim 10, wherein the first stressor includes nitride, a low-k material, or a high-k material, or a combination thereof.

12. The semiconductor device of claim 10, wherein the first stressor includes silicon carbon nitride (SiCN), silicon boron nitride (SiBN), boron nitride (BN), aluminum oxide ($AlO_x$), or hafnium oxide ($HfO_x$), or a combination thereof.

13. A semiconductor device, comprising:
a first gate structure including a cell region and a contact region;
a channel structure located in the cell region of the first gate structure; and
a supporter located in the contact region of the first gate structure,
wherein the supporter comprises:
a first sealing layer;
a first stressor in the first sealing layer; and
a second sealing layer in the first stressor, and
wherein the first sealing layer has a greater thickness than the second sealing layer.

14. A semiconductor device, comprising:
a first gate structure including a cell region and a contact region;
a channel structure located in the cell region of the first gate structure; and
a supporter located in the contact region of the first gate structure,
wherein the supporter comprises:
a first sealing layer;
a first stressor in the first sealing layer; and
a second sealing layer in the first stressor;
a second gate structure; and a slit structure located between the first gate structure and the second gate structure, wherein the slit structure comprises:

a first insulating layer;

a second stressor in the first insulating layer; and a second insulating layer in the second stressor, and wherein the slit structure extends from the cell region to the contact region.

15. The semiconductor device of claim 14, wherein the slit structure includes a source contact plug located in the second insulating layer.

16. The semiconductor device of claim 14, wherein at least one of the first insulating layer, the second stressor, and the second insulating layer includes a protrusion on an outer wall thereof.

17. A manufacturing method of a semiconductor device, the manufacturing method comprising:

forming a stack including a cell region and a contact region;

forming a first opening having a bowing shape in the contact region of the stack; and forming, in the first opening, a supporter including a first oxide layer, a first nitride layer, and a second oxide layer.

18. The manufacturing method of claim 17, wherein the forming of the supporter comprises:

forming the first oxide layer in the first opening;

forming the first nitride layer in the first oxide layer; and forming the second oxide layer in the first nitride layer.

19. The manufacturing method of claim 18, wherein the second oxide layer includes a void therein.

20. The manufacturing method of claim 17, further comprising:

forming, in the stack, a second opening extending from the cell region to the contact region and having a bowing shape; and forming, in the second opening, a slit structure including a third oxide layer, a second nitride layer in the third oxide layer, and a fourth oxide layer in the second nitride layer.

21. The manufacturing method of claim 20, wherein the forming of the slit structure comprises:

forming a source contact plug in the fourth oxide layer.

22. The manufacturing method of claim 21, wherein the source contact plug includes a void therein.

\* \* \* \* \*